United States Patent [19]

Asao

[11] Patent Number: 5,847,967
[45] Date of Patent: Dec. 8, 1998

[54] METHOD OF CALCULATING A PARASITIC LOAD IN A SEMICONDUCTOR INTEGRATED CIRCUIT

[75] Inventor: Kazuki Asao, Tokyo, Japan

[73] Assignee: NEC Corporation, Tokyo, Japan

[21] Appl. No.: 688,736

[22] Filed: Jul. 31, 1996

[30] Foreign Application Priority Data

Jul. 31, 1995 [JP] Japan .................................. 7-195046

[51] Int. Cl.$^6$ .................................................. G06F 17/00
[52] U.S. Cl. .......................... 364/489; 364/488; 364/490; 364/491; 364/578; 395/500
[58] Field of Search .................. 395/50, 75, 76, 395/77, 500; 364/578, 488, 489, 490, 491

[56] References Cited

U.S. PATENT DOCUMENTS

| | | |
|---|---|---|
| 4,651,284 | 3/1987 | Watanabe et al. .................... 364/491 |
| 5,086,477 | 2/1992 | Yu et al. ................................ 382/8 |
| 5,452,224 | 9/1995 | Smith, Jr. et al. .................... 364/488 |

*Primary Examiner*—Kevin J. Teska
*Assistant Examiner*—A. S. Roberts
*Attorney, Agent, or Firm*—Sughrue, Mion, Zinn, Macpeak & Seas, PLLC

[57] ABSTRACT

A reference connection pattern is determined within a three-dimensional region together with the other connection patterns to extract data for pattern matching operation from a position of each connection pattern. An estimated parasitic load is also given as the data and is stored as a part of reference pattern data to form a data base. By the pattern matching operation between the reference pattern data and an object pattern, a coincident one of the reference pattern data is determined as a practical parasitic load. Thus, the estimated parasitic load included in the reference pattern data is detected as the practical parasitic load in the object pattern.

8 Claims, 5 Drawing Sheets

METHOD OF CALCULATING A PARASITIC LOAD IN A SEMICONDUCTOR INTEGRATED CIRCUIT

BACKGROUND OF THE INVENTION

This invention relates to a method of calculating a parasitic load, such as a parasitic capacity and a parasitic resistance, which results from a connection pattern in a semiconductor integrated circuit.

Recent development has been directed to a semiconductor integrated circuit which is very large-scaled in integration and very fine in structure. In such a semiconductor integrated circuit, it has been difficult to neglect a parasitic load, such as a parasitic capacity and a parasitic resistance, which results from a signal line or a connection pattern because a serious problem takes place due to a delay time caused by the parasitic load. Under the circumstances, a simulation model has been considered in a conventional delay verification tool to simulate the parasitic load but is insufficient in accuracy for simulating such a recent semiconductor integrated circuit. Specifically, a result of verification in timing simulation is inaccurate and inconsistent with an actual trial product. In this event, design modification and trial manufacture must repeatedly be carried out to improve inconsistency between the simulation model and the trial product. This results in lengthening a time designed for a new semiconductor integrated circuit.

Typically, it is a recent trend that performance of a semiconductor integrated circuit is determined by a parasitic load caused by connection patterns which are used to connect a plurality of transistors to one another when such transistors become very small in size to the order of sub-microns and carry out a switching operation at a high speed.

Generally, the semiconductor integrated circuit inevitably has a delay time resulting from presence of the parasitic load parasitic on the connection pattern in addition to the switching operation of the transistors. Thus, such a delay time is one of key factors deciding a performance of the semiconductor integrated circuit. Under the circumstances, it is very important in designing the semiconductor integrated circuit to estimate and evaluate the parasitic load with a higher accuracy than that achieved in prior art. Such accurate estimation and evaluation bring about a reduction of a time period required in designing the semiconductor integrated circuit.

On the other hand, various kinds of layout data which are indicative of a layout of the semiconductor integrated circuit have been used to manufacture trial samples of LSIs and to evaluate them. Herein, it is to be noted that the layout data include a transistor size, a pattern width, a contact size, and so on, which are determined with reference to a design standard for the semiconductor integrated circuit.

Proposals have been made as regards a method of estimating the parasitic load by the use of the above-mentioned layout data. For example, Japanese Unexamined Patent Publication No. 273583/1992 (hereinafter referred to as Reference 1) discloses a method of verifying the layout data of the semiconductor integrated circuit in consideration of a parasitic load also. In this method, connection patterns arranged on each layer plane of a semiconductor integrated circuit diagram are divided by a plurality of rectangular meshes in a mesh pattern. For each rectangular mesh, design data are extracted from the connection patterns in the form of symbolic data together with values of parasitic loads. Since the symbolic data can be used, it is possible with this method not only to directly calculate connection data on the mesh pattern but also to determine the parasitic load in each single mesh. In addition, a total of the connection loads can be calculated by counting the number of meshes and the number of contacts.

In this calculating method, it is also possible to calculate, as the parasitic load, a capacity between each connection pattern and a ground pattern as well as a parasitic resistance in the connection pattern.

Japanese Unexamined Patent Publication No. 81365/1993 (hereinafter called Reference 2) discloses a parasitic capacity estimating method which is capable of estimating not only a parasitic capacity among connection patterns arranged in a single connection pattern layer but also an interlayer parasitic capacity between different connection pattern layers. In this method, the connection patterns on the single connection pattern layer or on the different connection pattern layers are divided on each layer plane by rectangular meshes to form a mesh pattern. Thereafter, calculation is made about lengths and areas which are overlapped with and which are adjacent to the connection patterns among the connection pattern layers. As a result, it is possible to calculate the above-mentioned parasitic capacity among the connection patterns and the interlayer parasitic capacity between the different connection pattern layers.

In the method described in Reference 1, the parasitic load which can be calculated is restricted only to the parasitic capacity between each connection pattern and the ground pattern and the parasitic resistance in each connection pattern. Specifically, no calculation can be made about the parasitic capacity among the connection patterns and the interlayer parasitic capacity mentioned in Reference 2.

On the other hand, the method described in Reference 2 is capable of calculating the parasitic capacity between two adjacent ones of the connection patterns within the single layer, and the interlayer parasitic capacity between two connection patterns which are arranged on different connection pattern layers and which are overlapped with each other in the vertical direction.

It is noted here that, in the semiconductor integrated circuit of the type described, there are a wide variety of connection patterns which include not only the connection patterns horizontally or vertically positioned but also a number of connection patterns which are located at positions oblique to one another and which are never overlapped with one another horizontally and/or vertically. This shows that no accurate calculation values are obtained when no consideration is made about parasitic capacities among the connection patterns which are remote from one another as well as the parasitic capacities among the adjacent connection patterns. As regards Reference 2, no consideration is made about the parasitic capacity between a certain connection pattern and another connection pattern located at a position oblique thereto. Accordingly, the parasitic capacity can not be accurately calculated in Reference 2.

SUMMARY OF THE INVENTION

It is therefore an object of this invention to provide a parasitic load calculating method which is capable of accurately calculating a parasitic load, such as a parasitic capacity and a parasitic resistance, caused by connection patterns.

It is another object of this invention to provide a parasitic load calculating method which is capable of calculating the parasitic load by the use of a pattern matching technique.

It is still another object of this invention to provide a reference pattern data preparing method of preparing a set of reference pattern data necessary for a pattern matching operation.

According to this invention, there is provided a parasitic load calculating method of calculating a parasitic load in layout data or symbolic data, comprising the steps of preliminarily preparing a reference model including reference pattern data composed of reference layout pattern data and an estimated parasitic load; and carrying out pattern matching operation between said reference layout pattern data and layout pattern data represented by the layout data or the symbolic data to thereby calculate the parasitic load in the layout data or the symbolic data.

According to this invention, there is also provided a reference pattern data preparing method comprising the steps of defining a particular connection pattern as a reference connection pattern; preliminarily determining a three-dimensional region containing the reference connection pattern; extracting data required in pattern matching operation from a layout pattern comprising a combination of the reference connection pattern, remaining connection patterns arranged on mesh patterns within the three-dimensional region except the reference connection pattern, and a substrate; and preparing reference pattern data by the use of the data thus extracted.

DESCRIPTION OF THE PREFERRED EMBODIMENTS

Figure 1:
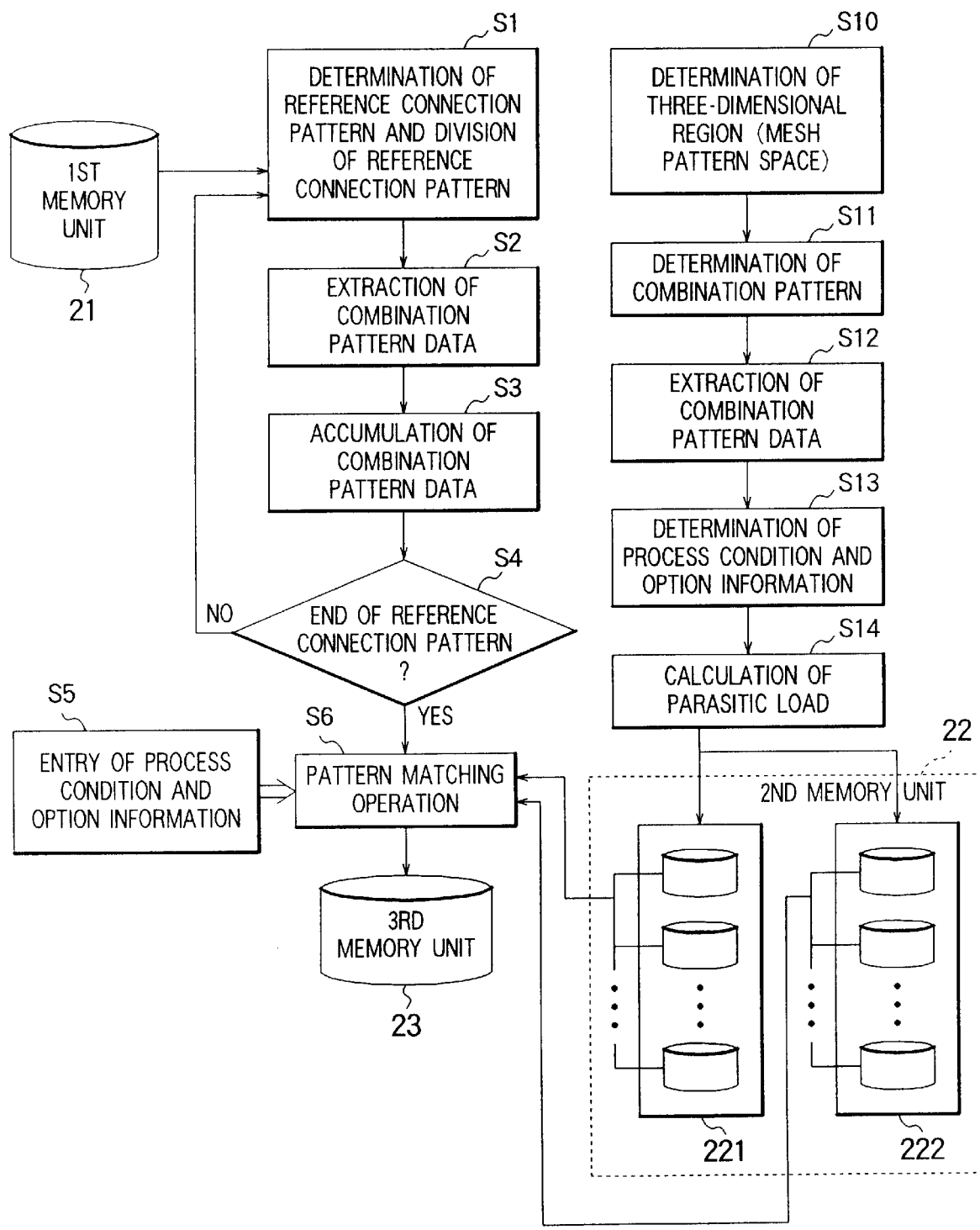
FIG. 1 is a flow chart for describing a parasitic load calculating method according to one embodiment of this invention.

Referring to FIG. 1, description will be made as regards a parasitic load calculating method according to an embodiment of this invention. According to this embodiment, first through third memory units 21 through 23 are used to calculate a parasitic load in a manner to be described later and are assumed to be implemented by magnetic disk units. At any rate, it should be understood that a result of calculation is memorized in the third memory unit 23.

Specifically, the first memory unit 21 stores layout data or symbolic data relating to a semiconductor integrated circuit for which the parasitic load is to be calculated. In this case, the layout data or the symbolic data are extracted in accordance with a design standard and specify patterns (paths), configurations, such as rectangles, contacts, and the like which are represented on a predetermined coordinate having an origin determined at a desired location of the semiconductor integrated circuit. The layout data can specify a three-dimensional structure in combination with thickness data of connection patterns and data of insulators between the connection patterns. In other words, the layout data represent three-dimensional positions on three-dimensional meshes of a three-dimensional region.

The second memory unit 22 stores reference pattern data which are similar to the layout data within the three-dimensional region and which specify a reference model.

The reference pattern data are stored in the second memory unit 22 in the form of a data base. The reference pattern data include connection pattern information on the three-dimensional meshes and an estimated parasitic load related to the connection patterns.

The reference pattern data will presently be described in detail. Within the three-dimensional region, the three-dimensional meshes are provided. Among connection patterns on the meshes, a particular connection pattern for which the parasitic load is to be calculated is defined as a reference connection pattern. Around the reference connection pattern, there exist adjacent connection patterns and intersecting connection patterns. A combination of the reference connection pattern, the adjacent connection patterns, the intersecting connection patterns, and a substrate forms a layout pattern which determines the layout pattern data. The reference pattern data include the layout pattern data and the estimated parasitic load for the reference connection pattern. It will be understood that a wide variety of layout patterns can be formed by any reference connection pattern, the other connection patterns on the meshes except the reference connection pattern, and the substrate. In correspondence to such wide variety of layout patterns, the reference pattern data include a number of sets of the layout pattern data together with the estimated parasitic loads on the reference connection pattern. The estimated parasitic load on the reference connection pattern can be obtained in the form of a measurement value measured by a real device or a simulation result calculated by a capacity simulator.

Figure 2:
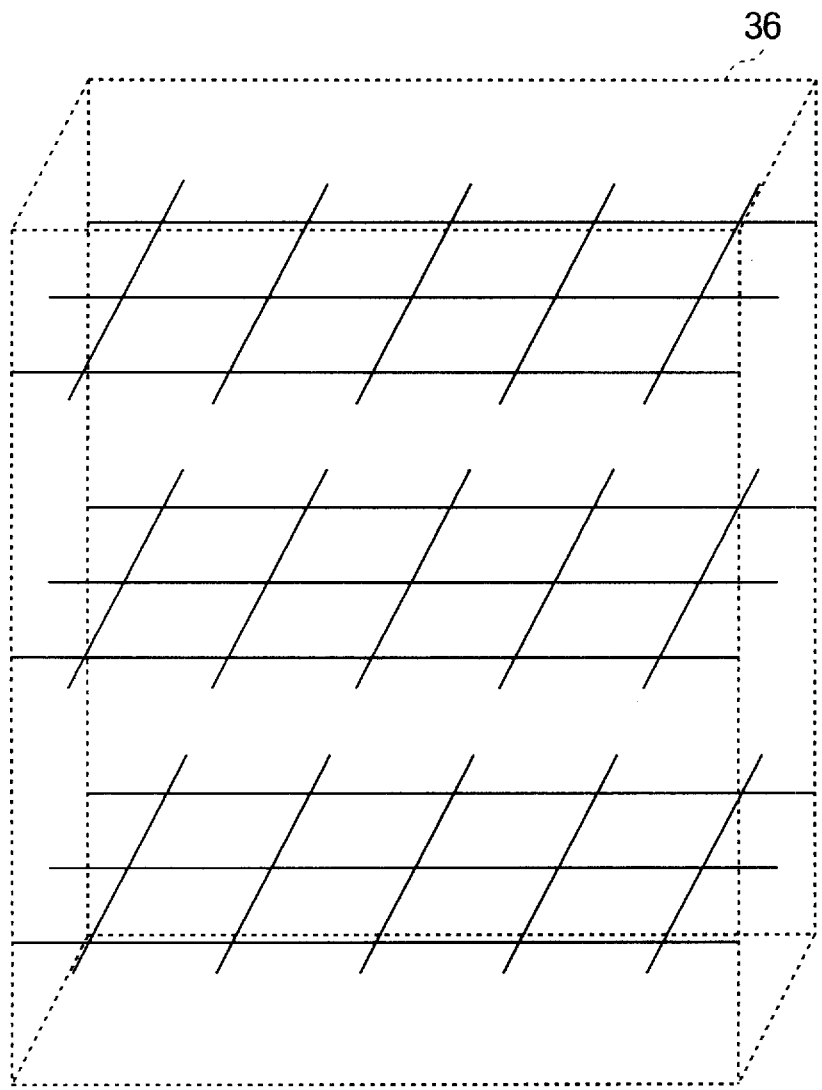
FIG. 2 shows mesh patterns used in the method illustrated in FIG. 1.
Figure 3:
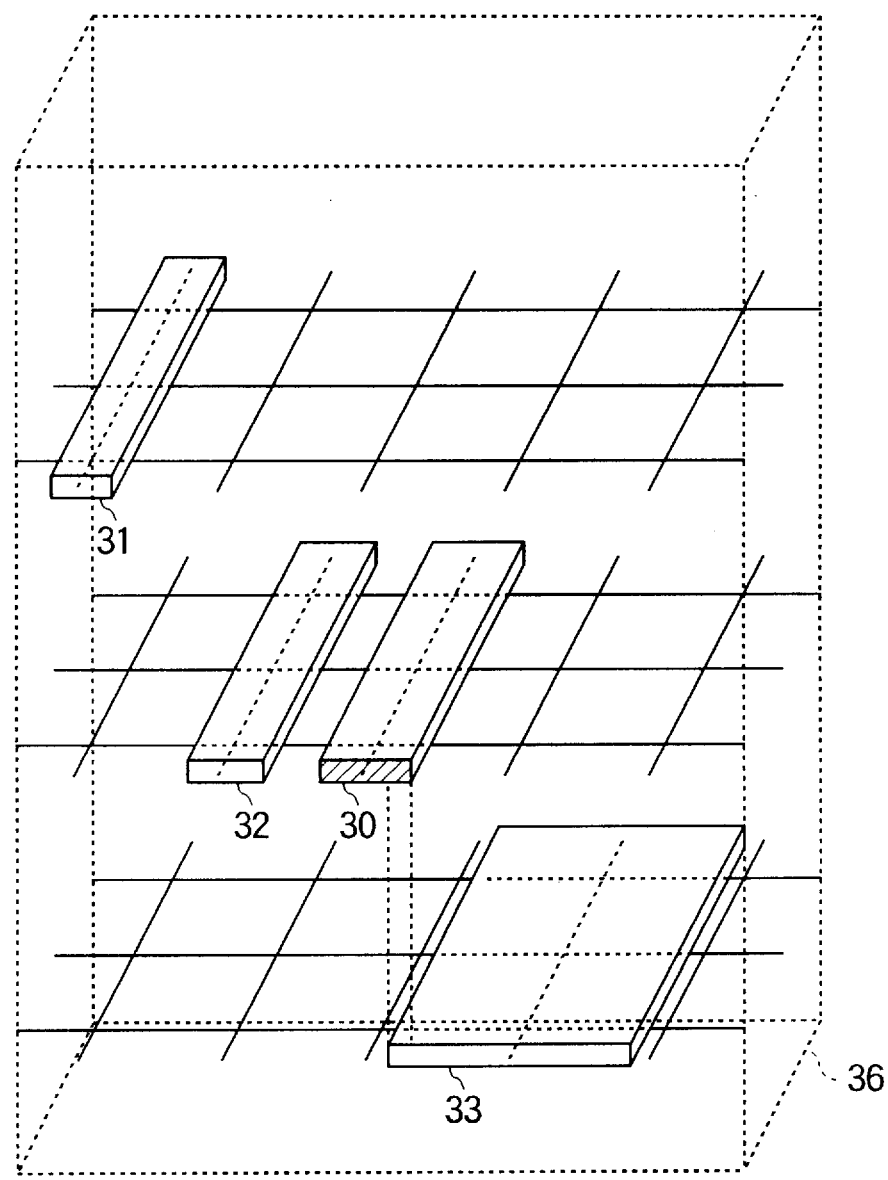
FIG. 3 shows a pattern arrangement for describing the method illustrated in FIG. 1 more in detail.

Referring to FIGS. 1, 2, and 3 in combination, description will be made about a method of preparing the reference pattern data for use in calculating the parasitic load according to this invention.

At first referring to FIG. 2, a mesh pattern space 36 is determined as a three-dimensional region of a desired size (step S10 in FIG. 1). The mesh pattern space 36 is partitioned by three-dimensional meshes. The meshes are composed of a plurality of straight lines extending in parallel to each other in a lengthwise direction from the front side to the rear side of the drawing sheet and in a widthwise direction perpendicular to the lengthwise direction with unit gaps kept both in the lengthwise and the widthwise directions. It is supposed that any connection pattern present within the mesh pattern space 36 is positioned on the mesh lines. In the example being illustrated, three mesh layers are contained within the mesh pattern space 36.

Next referring to FIG. 3, connection patterns 30 through 33 are laid out on the meshes within the mesh pattern space 36 illustrated in FIG. 2. In FIG. 3, the connection pattern 30 is selected as a reference connection pattern from the connection patterns 30 through 33. The illustrated reference connection pattern 30 is located at the center of the mesh pattern space 36 placed along the widthwise direction which is horizontal extended in FIG. 3.

Within the mesh pattern space 36, the remaining connection patterns 31 through 33 are arranged around the reference connection pattern 30 and will hereinafter be referred to as first through third peripheral connection patterns, respectively. The first through the third peripheral connection patterns 31 through 33 extend in the lengthwise direction in parallel to the reference connection pattern 30.

As illustrated, the first peripheral connection pattern 31 is located at an upper level of the reference connection pattern 30 and does not overlap the reference connection pattern 30 in a height direction perpendicular to the widthwise and the lengthwise directions. On the other hand, the second peripheral connection pattern 32 is located at the same height or level as the reference connection pattern 30 and juxtaposed with the reference connection pattern 30 in the widthwise direction with the unit gap left therebetween. The third peripheral connection pattern 33 is located at a lower level of the reference connection pattern 30. The third peripheral connection pattern 33 partially overlaps the reference connection pattern 30 in the height direction but does not overlap the second peripheral connection pattern 32 in the height direction.

The reference connection pattern 30 and the first through the third peripheral connection patterns 31 through 33 are positioned on the mesh lines within the mesh pattern space 36.

The reference pattern data are determined for the mesh pattern space 36 containing the meshes and include the parasitic load data.

In the embodiment illustrated in FIG. 1, a layout pattern (hereinafter called a combination pattern) within the mesh pattern space 36 is determined (step S11). The combination pattern comprises a combination of the reference connection pattern 30, the first through the third peripheral connection patterns 31 through 33, and the substrate. Layout pattern data are determined by the combination pattern and extracted as extracted combination pattern data (step S12). Next, a process condition and option information are determined (step S13). For each mesh pattern space containing the meshes, calculation is made of the parasitic load on the reference connection pattern 30 in the extracted combination pattern data so as to satisfy each process condition and the option information (step S14). Herein, the option information is indicative of a package dependency, an operation frequency, and the like. Alternatively, the parasitic load on the reference connection pattern 30 in the extracted combination pattern data may be calculated so as to satisfy either one of the process condition and the option information.

In the example being illustrated, a first calculation result satisfies the process condition alone while a second calculation result satisfies both the process condition and the option information. Each of these calculation results is combined with the corresponding combination pattern data to form the reference pattern data. The reference pattern data composed of the first calculation result are stored in a first data base section 221 while the reference pattern data composed of the second calculation result are stored in a second data base section 222. The first and the second data base sections 221 and 222 are included in the second memory unit 22 (reference model). In this case, the widths of the reference connection pattern 30 and the peripheral connection patterns need not be equal to each other.

In the similar manner, the reference pattern data are prepared for every desired one of the combination patterns possibly present within the mesh pattern space having been determined in the step S10 in FIG. 1. The reference pattern data thus prepared are stored in the first and the second data base sections 221 and 222.

As will be clear from the foregoing, it is possible to increase an accuracy of the parasitic load on the reference connection pattern contained in the reference pattern data as the mesh pattern space has a greater scale.

Next referring to FIGS. 1 through 4 in combination, description will be made as regards a calculating operation according to the parasitic load calculating method.

At first, the layout pattern data represented by either the layout data or the symbolic data are read as read layout pattern data. With respect to the read layout pattern data, a particular connection pattern for which the parasitic load is to be calculated is determined as the reference connection pattern. The reference connection pattern thus determined is divided in its longitudinal direction by a three-dimensional region having a size and a configuration similar to those of the three-dimensional region previously defined upon preparation of the reference pattern data (step S1 in FIG. 1). It is assumed here that the reference connection pattern is located at the center within the three-dimensional region in the widthwise direction perpendicular to the lengthwise direction of the reference connection pattern, like in the preparation of the reference pattern data.

Figure 4:
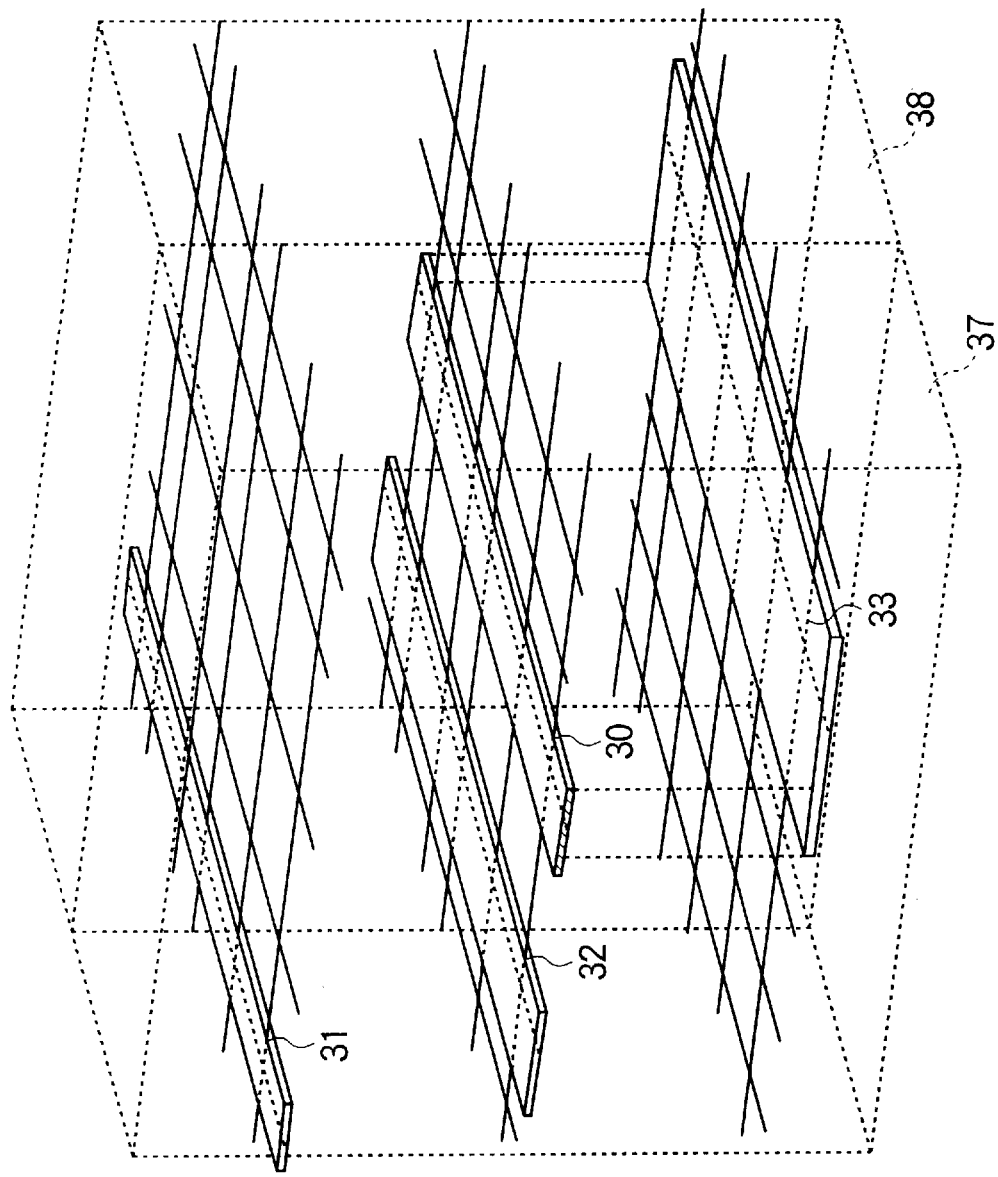
FIG. 4 shows another pattern arrangement for use in describing the parasitic load calculating method in FIG. 1.

FIG. 4 shows mesh pattern spaces 37 and 38 defined as a pair of divided three-dimensional regions and the layout pattern data within the three-dimensional regions. Thus, FIG. 4 is different from FIG. 3 in that the two mesh pattern spaces are formed.

Referring to FIG. 4, the mesh pattern spaces 37 and 38 as well as meshes present within the mesh pattern spaces 37 and 38 are contiguous to each other in the lengthwise direction intersecting the drawing sheet of FIG. 4 with no offset both in the height and the widthwise directions. Each of the mesh pattern spaces 37 and 38 and the meshes contained therein has a configuration and a size similar to those of the mesh pattern space 36 and the meshes illustrated in FIGS. 2 and 3.

Within the mesh pattern spaces 37 and 38, the reference connection pattern 30 and the first through the third peripheral connection patterns 31 through 33 are located on the meshes. Throughout the both mesh pattern spaces 37 and 38, each of these connection patterns 30 through 33 continuously extends in the lengthwise direction in FIG. 4 with no offset in the height and the widthwise directions. These connection patterns 30 through 33 are arranged in a manner similar to those contained in the mesh pattern space 36 illustrated in FIGS. 2 and 3.

After completion of the above-mentioned division of the reference connection pattern 30, detection is made of combination pattern data within one of the three-dimensional regions, namely, the mesh pattern space 37 (step S2 in FIG. 1). Then, the combination pattern data thus detected are accumulated (step S3 in FIG. 1). After accumulation of the combination pattern data, it is confirmed whether or not the reference connection pattern 30 comes to an end (step S4 in FIG. 1). In the example illustrated in FIG. 4, there is another three-dimensional region depicted as the mesh pattern space 38 contiguous to the mesh pattern space 37 and the reference connection pattern 30 further extends through the mesh pattern space 38. In this situation, another combination pattern data within the mesh pattern space 38 are detected and accumulated. Thus, the combination pattern data within each of the three-dimensional regions are detected and accumulated as the accumulated combination pattern data in the similar manner until the reference connection pattern 30 comes to an end.

After the reference connection pattern 30 comes to an end, the process condition and the option information are supplied from an external input apparatus (step S5 in FIG. 1). It is noted here that the option information includes the package dependency, the operation frequency, and the like.

When the process condition and the option information are supplied from the external input apparatus, pattern matching operation is carried out between the accumulated combination pattern data and the above-mentioned extracted combination pattern data contained in the respective reference pattern data stored in the second memory unit (reference model) (step S6 in FIG. 1). Thus, detection is made of the reference pattern data which have the extracted combination pattern data coincident with the accumulated combination pattern data and which satisfy the desired process condition and option information. For the reference pattern data thus detected, the parasitic load is calculated. This pattern matching operation is carried out for all of the accumulated combination pattern data and the parasitic loads of the reference pattern data of coincidence are calculated and accumulated.

In the above-mentioned manner, it is possible to calculate the parasitic load on the particular connection pattern in the layout data or the symbolic data. The parasitic load thus calculated is supplied to the memory unit 23.

It will be understood that the parasitic load may include not only the parasitic capacity but also the parasitic resistance.

Figure 5:
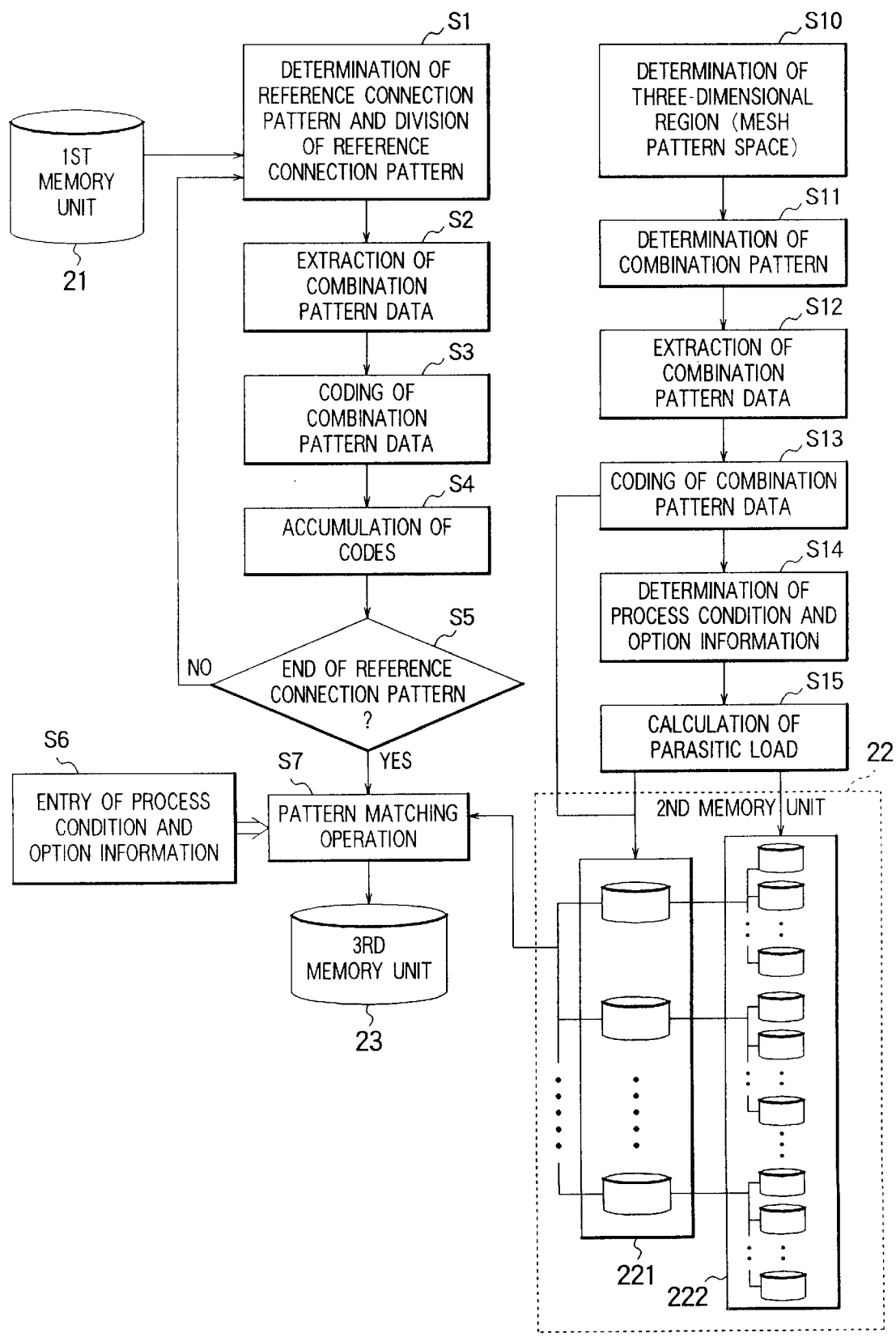
FIG. 5 is a flow chart for describing a parasitic load calculating method according to another embodiment of this invention.

Referring to FIG. 5, description will be made as regards a parasitic load calculating method according to another embodiment of this invention.

In the parasitic load calculating method according to the foregoing embodiment described in conjunction with FIG. 1, the pattern matching operation is carried out between the combination pattern data formed by the layout data or the symbolic data and the combination pattern data contained in the reference pattern data. On the other hand, pattern matching operation is carried out by the use of codes in this embodiment. Specifically, the combination pattern data represented by the layout data or the symbolic data and the combination pattern data contained in the reference pattern data are both converted into simplified codes under a common rule of conversion. By the use of these codes, the pattern matching operation is carried out. These codes are uniquely determined in correspondence to the individual combination pattern data, respectively.

Referring to FIG. 5, a three-dimensional region of a desired size is determined as a mesh pattern space in a manner similar to that described in conjunction with FIG. 1 (step S10 in FIG. 5). Thereafter, for each of all reference connection patterns possibly present within the three-dimensional region thus determined, decision is made of the combination pattern of the reference connection pattern, peripheral connection patterns around the reference connection pattern, and the substrate (step S11 in FIG. 5). For each combination pattern thus decided, desired combination pattern data are extracted as the extracted combination pattern data (step S12 in FIG. 5). The extracted combination pattern data are converted into the simplified codes to be stored in the memory unit 221 (step S13 in FIG. 5). Next, the process condition and the option information are determined (step S14 in FIG. 5). After the process condition and the option information are determined, the parasitic load is calculated for each code in those cases where the process condition alone is satisfied, where the option information alone is satisfied, and where both the process condition and the option information are satisfied. The parasitic load thus calculated is stored in the memory unit 222. In the illustrated example, the reference pattern data comprise the codes stored in the memory unit 221 and the parasitic load corresponding to the codes and stored in the memory unit 222. It is noted here that the memory units 221 and 222 are contained in the memory unit 22 (reference model).

For the combination pattern data represented by the layout data or the symbolic data supplied as input data, the reference connection pattern is determined and divided by each three-dimensional region having a size and a configuration identical with those of the three-dimensional region determined in the step S10 (step S1 in FIG. 5). After completion of the above-mentioned division, the combination pattern data within the three-dimensional region are extracted as the extracted combination pattern data (step S2 in FIG. 5). The extracted combination pattern data are converted into the simplified codes (step S3 in FIG. 5). These codes are accumulated as accumulated codes (step S4 in FIG. 5). After completion of the accumulation of the codes, it is confirmed whether or not the reference connection pattern comes to an end (step S5 in FIG. 5). Similarly, the steps S1 through S5 are repeatedly carried out until the reference connection pattern comes to an end. When the reference connection pattern comes to an end, the process condition and the option information are entered from the external input apparatus (step S6 in FIG. 5). After entry of the process condition and the option information, pattern matching operation is carried out between the accumulated codes and the codes corresponding to the respective reference pattern data stored in the memory unit 221. Upon detection of coincidence between these codes, the parasitic load is extracted from the memory unit 222 that corresponds to the codes of coincidence and that satisfies the process condition and the option information having been entered (step S7 in FIG. 5).

The above-mentioned pattern matching operation is carried out for all of the accumulated combination pattern data and the parasitic loads of the reference pattern data detected to be coincident are accumulated. Thus, for any desired connection pattern, it is possible to calculate the parasitic load in the layout data or the symbolic data. The parasitic load thus calculated is supplied to the memory unit 23.

It will be understood that the parasitic load may contain not only the parasitic capacity but also the parasitic resistance.

According to this invention, the data are processed by the use of the pattern matching technique for the three-dimensional region. Therefore, it is possible to calculate the parasitic capacity between the reference connection pattern and all of the remaining connection patterns within the region and between the reference connection pattern and the substrate.

What is claimed is:

1. A parasitic load calculating method of calculating a parasitic load in layout data or symbolic data, comprising the steps of:

preliminarily preparing a reference model including reference pattern data composed of reference layout pattern data and an estimated parasitic load, said reference layout pattern data being based on one or more connection patterns of a three-dimensional region, said estimated parasitic load being based on a parasitic load of said three-dimensional region for both overlapping and non-overlapping ones of said one or more connection patterns; and carrying out a three-dimensional pattern matching operation between said reference layout pattern data and layout pattern data represented by said layout data or said symbolic data to thereby calculate said parasitic load based on said estimated parasitic load.

2. A reference pattern data preparing method, comprising:

defining a particular connection pattern as a reference connection pattern;

preliminarily determining a three-dimensional region containing said reference connection pattern, wherein any other connection patterns included in said three-dimensional region define peripheral connection patterns; and preparing reference pattern data based on the layout of said reference connection pattern, said peripheral connection patterns, and a substrate within said three-dimensional region, wherein said reference pattern data includes information pertaining to a relation between said reference connection pattern and at least one oblique peripheral connection pattern, wherein said oblique peripheral connection pattern is one of said peripheral connection patterns of said three-dimensional region, does not overlap vertically with said reference connection pattern, and does not overlap horizontally with said reference connection pattern.

3. A reference pattern data preparing method as claimed in claim 2, wherein a plurality of three-dimensional regions are determined by division in a widthwise direction, a lengthwise direction, and a height direction of said reference connection pattern.

4. A reference pattern data preparing method as claimed in claim 3, wherein the reference connection pattern and the peripheral connection patterns are extracted within a mesh pattern space defined by each of said three-dimensional regions.

5. A reference pattern data preparing method as claimed in claim 3, wherein the reference pattern data is prepared so as to include information relating to:

the positions, configuration, and thickness of said reference and peripheral connection patterns, the thickness of an oxide film, a substrate, and the presence or absence of throughholes.

6. A reference pattern data preparing method as claimed in claim 2, wherein said reference pattern data include layout pattern data extracted from a layout pattern of said connection patterns and said substrate within said three-dimensional region, and data representative of an estimated parasitic load corresponding to said layout pattern.

7. A reference pattern data preparing method as claimed in claim 6, wherein said reference pattern data include those data representative of a process condition, a package dependency, and the estimated parasitic load corresponding to an operation frequency.

8. A reference pattern data preparing method as claimed in claim 6, further comprising the steps of:

extracting said reference pattern data required in said pattern matching operation for each of said three-dimensional regions of different sizes; and obtaining the estimated parasitic load on said reference connection pattern within each three-dimensional region as a part of said reference pattern data.

* * * * *